United States Patent [19]

Gray et al.

[11] Patent Number: 4,922,371

[45] Date of Patent: May 1, 1990

[54] ESD PROTECTION CIRCUIT FOR MOS INTEGRATED CIRCUITS

[75] Inventors: Richard L. Gray, Cupertino; Raymond Chan-Man Yan, Daly City; Bruce Rosenthal, Los Gatos, all of Calif.

[73] Assignee: Teledyne Semiconductor, Mountain View, Calif.

[21] Appl. No.: 265,572

[22] Filed: Nov. 1, 1988

[51] Int. Cl.$^5$ .............................................. H02H 9/04
[52] U.S. Cl. ....................................... 361/91; 361/92; 361/111; 357/23.13; 307/561
[58] Field of Search ...................... 361/56, 91, 90, 92, 361/111; 307/540, 542, 551, 557, 558, 339, 561; 357/23.13

[56] References Cited

U.S. PATENT DOCUMENTS

| | | | |
|---|---|---|---|
| 3,712,995 | 1/1973 | Steudel | 361/91 |
| 3,879,640 | 6/1975 | Schade, Jr. | 361/91 |
| 3,999,205 | 12/1976 | Stewart | 361/111 |
| 4,131,928 | 12/1978 | Davis et al. | 361/56 |
| 4,158,863 | 6/1979 | Naylor | 361/91 |
| 4,626,882 | 12/1986 | Cottrell | 357/23.13 |

Primary Examiner—William M. Shoop, Jr.
Assistant Examiner—H. L. Williams
Attorney, Agent, or Firm—Gerald B. Rosenberg

[57] ABSTRACT

An ESD protection circuit, suitable for use as part of an integrated circuit, limits the voltage potential at the contacts of the integrated circuit to a voltage potential difference range relative to, though extending beyond the voltage source potentials of the circuit protected. The ESD protection is effective regardless of whether the integrated circuit is powered. The ESD protection circuit includes a clamp subcircuit for limiting the voltage potential at a clamp point to a first voltage range approximately defined by the voltage source potentials and a voltage offset subcircuit, coupled between the clamp point and an integrated circuit contact, to establish a second voltage range encompassing the first voltage range. The voltage offset subcircuit conducts current between the clamp point and the contact to limit the voltage potential at the contact to the second voltage range.

12 Claims, 3 Drawing Sheets

ESD PROTECTION CIRCUIT FOR MOS INTEGRATED CIRCUITS

FIELD OF THE INVENTION

The present invention is generally related to transient voltage protection circuits for MOS integrated circuits and, in particular, to electrostatic discharge (ESD) protection circuits that provide for the protection of the inputs and outputs of MOS circuits against voltage levels outside of a predefined protection voltage range greater than the available voltage supply potential difference of the integrated circuit.

BACKGROUND OF THE INVENTION

Conventionally, the input and output connections to MOS integrated circuits must be protected from electrostatic discharge (ESD) voltages as may occur in the ordinary handling of an MOS integrated device or as a consequence of the environment in which the device is operated. This sensitivity to ESD voltages is generally due to the thinness of the MOS transistor gate oxide layer as a desired necessity for fast MOS transistors. Typically, a conventional MOS transistor will have a gate oxide thickness of approximately 600 Angstroms, resulting in an oxide breakdown voltage of approximately 50 to 60 volts. However, ESD voltages may easily reach several hundred volts. Although current limited, ESD voltages substantially greater than the gate oxide breakdown voltage will severely degrade, if not destroy the affected MOS transistors.

A simple ESD diode network can be utilized to clamp input and output voltages to the voltage supply rails of the integrated circuit. Thus, any over-voltage or under-voltage is shunted through a forward biased diode to a corresponding supply rail.

A limitation in the use of such ESD diode networks is that the diodes themselves may be damaged by the current associated with very high ESD voltages. A resistor is therefore often used as a current limiter. Typically, a low resistive value is placed between the bonding pad, in turn connected to the external contact of the integrated circuit, and the remainder of the integrated circuit generally including the ESD protection diode network. Only a small resistive value of on the order of 100 to 1 K: is necessary to provide the required current limiting to protect the diode network. Indeed, a low value is generally desired to minimally impact the speed of the integrated circuit as a whole.

A distinctive problem of even such modified ESD diode networks is that some conventional MOS integrated circuits are expected to operate normally with input and output voltages that are significantly outside of the voltage range defined by the integrated circuit's voltage supply rail potentials. Operation of such integrated circuits, if not simply precluded, may be significantly compromised by effects secondary to the operation of the ESD diode network. For example, an externally sustained or periodic input or output voltage only a few volts above the integrated circuit's positive voltage supply rail potential, though otherwise acceptable, will result in a substantial current being shunted by a protection network diode to the positive supply voltage rail. Not only does this result in the creation of substantial voltage supply noise directly on-chip with the integrated circuit, but this may result in substantial asymmetric or surge heating of the integrated circuit. If instead the externally sustained voltage potential is several volts below the negative voltage supply rail potential, a false ground or reference voltage condition may arise in addition to any associated noise and heating problems. Consequently, the operational accuracy of the integrated circuit may be compromised.

In any case, the substantial current passed by the ESD protection diode network may invoke the operation of a parasitic transistor inherently present as a consequence of integrated circuit monolithic fabrication. The uncontrolled operation of a parasitic transistor will, in turn, force the integrated circuit into a latched-up or completely inoperative state that, if not destructive, requires all power to be removed from the integrated circuit before proper operation is restored.

An alternate approach to ESD voltage protection is to utilize an active circuit network. However, the required circuit complexity, power consumption entailed and usage of integrated circuit surface area as necessary for an active circuit network sufficient to provide ESD voltage protection will generally outweigh the benefits that might be had over using a simple ESD diode network. Consequently, the use of active ESD integrated circuit voltage protection circuits is generally not preferred.

SUMMARY OF THE INVENTION

A general purpose of the present invention, therefore, is to provide a passive ESD voltage protection circuit for general application in the protection of MOS integrated circuit that allows for input and output voltages significantly in excess of the integrated circuit voltage supply potentials.

This is achieved in the present invention by the provision of a circuit that limits the voltage potential at a contact point of an integrated device to a range of potentials defined relative to first and second predetermined voltage source potentials. The circuit includes a clamp subcircuit that limits the voltage potential at a clamp point in the circuit to a first voltage range approximately defined by the first and second predetermined voltage source potentials, and a voltage offset circuit, coupled between the clamp point and the contact point that establishes a second voltage range encompassing the first voltage range wherein the voltage offset circuit conducts current between the clamp point and contact point when the voltage potential at the contact point begins to exceed the second voltage range.

Thus, an advantage of the present invention is that it realizes a passive ESD voltage protection circuit that is compact, easy to fabricate using a wide variety of fabrication processes, and utilizes only well-characterized components.

Another advantage of the present invention is that the allowable range of contact voltages can be readily tailored to extend either symmetrically or asymmetrically from about 1.5 volts to any desired voltage level beyond the positive and negative voltage supply rail potentials as utilized by the integrated circuit.

A further advantage of the present invention is that, by allowing a contact voltage range that is appropriate for the anticipated contact voltages, an integrated circuit protected by the present invention is far less susceptible to latch-up and operational degradation due to thermal stress, voltage supply noise and ground currents.

BRIEF DESCRIPTION OF THE DRAWINGS

These and other attendant advantages and features of the present invention will be readily appreciated upon consideration of the following detailed description of the invention when considered in conjunction with the accompanying drawings, wherein like reference numerals designate like parts throughout the figures thereof, and wherein.

DETAILED DESCRIPTION OF THE INVENTION

Figure 1:
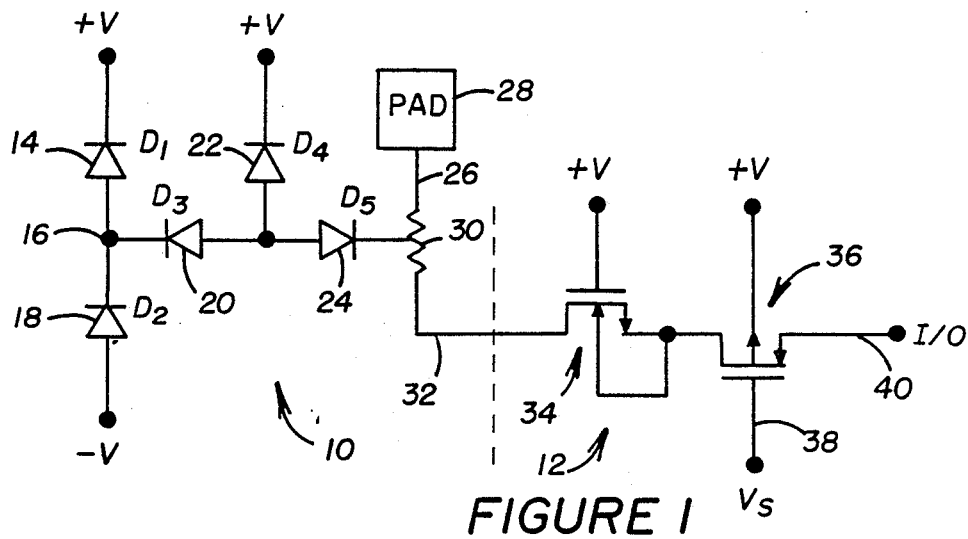
FIG. 1 is a circuit schematic of a preferred embodiment of the present invention.

A preferred embodiment of the ESD voltage protection circuit of the present invention, generally indicated by the reference numeral 10, is shown in FIG. 1. The circuit 10 protects an exemplary input buffer circuit 12 from ESD voltages. The circuit 10 includes a diode 14 having a cathode coupled to the positive voltage supply rail (+V) and an anode connected to a clamp point 16 in common with a cathode of another diode 18. The anode the diode 18 is coupled to the negative voltage supply rail (−V). Diodes 14, 18 may be conventional junction diodes having reverse breakdown voltages ($V_{bd}$) in excess of about 50 volts. The clamp point 16 is therefore limited to a voltage range of +V plus the forward conduction voltage drop ($V_{th}$) of the diode 14 to −V minus the forward voltage conduction drop of diode 18.

A pair of diodes 20, 24 and a resistor 30 operate to extend the clamp point 16 voltage range allowable at a contact point 26. The cathode of diode 20 is coupled to the clamp point 16 while the anode of diode 20 is coupled in common to the anodes of diode 24 and a diode 22. The cathode of diode 22 is also coupled to the positive voltage supply rail. The diode 22 is a nonessential element in the context of the present invention. However, the diode 22 occurs as a result of the preferred fabrication structure utilized to implement the ESD protection circuit 10 as part of an integrated circuit.

The cathode of diode 24 is coupled to the bulk of resistor 30. The terminal ends of resistor 30 are coupled between a contact point 26 and an input point 32 of the input circuit 12. The contact point 26 is further coupled to a bonding pad 28 that is, in turn, ultimately coupled to a connector pin of a finally constructed and packaged integrated circuit.

In operation, the reverse breakdown voltage ($V_{bd}$) of diode 20 effectively sets the most negative limit on the acceptable voltage potential range allowed at the contact point 26. As the voltage potential at the contact point 26 begins to exceed this negative range limit, diode 20 begins conducting a break-over current from the negative supply voltage rail through forward biased diodes 18, 24 and the resistor 30 to the contact point 26. This negative limit voltage potential is expressed by equation 1.

$$V_{-limit} = {}^-V - V_{thD2} - V_{bdD3} - V_{thD5} - (I_{ESD} \cdot R_{eff}) \quad \text{Eq. 1}$$

The forward biased voltage drop ($V_{th}$) of diodes 18, 24 is on the order of 0.6 volts. The reverse breakdown voltage potential of diode 20, depending on the specific details of its fabrication, may be between 20 and 50 volts. In the preferred embodiment of the present invention, where the gate oxide breakdown voltage potential of a MOS transistor is approximately 50 volts and the voltage supply rail potentials are +5 volts, respectively. The reverse breakdown voltage potential for diode 20 is chosen to be approximately 30 volts. Consequently, equation 1 yields a negative voltage potential limit at the contact point 26 of approximately 45 volts for the preferred embodiment.

The positive voltage potential limit at contact point 26 is largely controlled by the diodes 22, 24. As set forth in equation 2, the positive voltage limit for the contact point 26 is controlled predominantly by the reverse breakdown voltage potential of diode 24 an the forward biased voltage drop of diode 22.

$$V_{+limit} = {}^+V + V_{thD4} + V_{bdD5} + (I_{ESD} \cdot R_{eff}) \quad \text{Eq. 2}$$

If, however, diode 22 is omitted as a function of the specific fabrication of the protection circuit 10, the positive voltage potential limit is predominantly controlled by the reverse breakdown threshold of diode 24 and the forward voltage bias voltage drop of diodes 14 and 20. As can be seen from equations 1 and 3, the operational voltage limits of the protection circuit 10 are completely symmetric with the omission of diode 22.

$$V_{+limit} = {}^+V + V_{thD1} + V_{thD3} + V_{bdD5} + (I_{ESD} \cdot R_{eff}) \quad \text{Eq. 3}$$

Consequently, the allowable voltage limit range at the contact point 26 of the protection circuit 10 in the preferred embodiment is from approximately +34.4 volts to −35 volts. Given the low effective resistance value of the resistor 30, the input point 32 of the input/output interface circuit 12 is exposed to essentially the same limited range of voltage potentials.

The input/output interface circuit 12 includes an N-type MOS pass transistor 34 configured as a source follower to transfer an input signal from the input point 32 to the source of a P-type input-enable MOS transistor 36. A logic signal $V_s$, when applied to the gate 38 of the input-enable transistor 36 permits the input signal to be transferred onto the I/O line 40.

Figure 2:
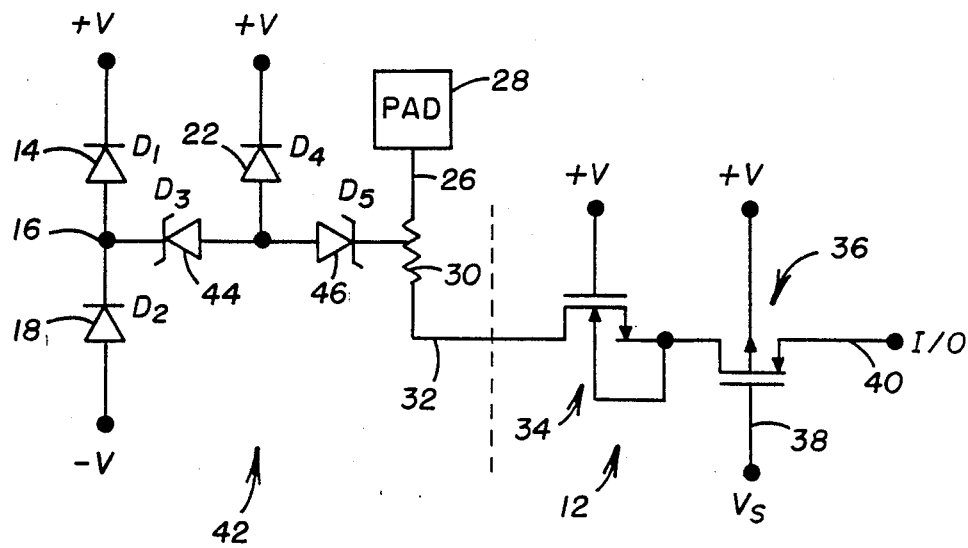
FIG. 2 is a circuit schematic of a first alternate preferred embodiment of the present invention.

Other input interface circuits as well as output buffer and driver circuits could be used in place of the specific interface circuit 12 shown. The only issue in regard to the design of such interface circuits, regardless of whether operating as an input, output or bidirectional signal interface, is to ensure that the gate or the interface transistors are not exposed to a potential difference in excess of their oxide breakdown voltage. In the case of the source follower 34, the gate oxide will be exposed to a maximum gate to source voltage potential difference of +V plus the magnitude of the negative voltage limit allowed by the protection circuit 10. With positive and negative voltage supply rail potentials of ±5 volts, the maximum gate to source voltage potential difference is 40 volts. With a 50 volt gate oxide breakdown potential, the resulting 10 volt margin represents an acceptable safety limit.

Where a greater safety margin is required, greater control over the limits of the acceptable voltage range is desired or larger source voltage rail potentials, relative to the MOS transistor gate oxide breakdown voltage, are used, the alternate embodiment of the present invention shown in FIG. 2 may be employed. The ESD protection circuit 42 differs from the protection circuit 10 in that diodes 44, 46 are fabricated as Zener diodes. Consequently though, depending on the specific details of fabrication, diodes 44 and 46 may have reverse breakdown voltages generally within the range of 4.7 to greater than 40 volts. Where, for example, the positive and negative voltage source rail potentials are ±12 volts, the MOS transistor gate oxide breakdown voltage potential is 50 volts and a 20 volt safety margin is desired, the Zener diodes 44, 46 can be fabricated with a Zener breakdown voltage ($V_z$) of approximately 6 volts. The positive and negative acceptance range limits imposed by this circuit 42 would, therefore, be ±18 volts. The maximum gate to source voltage potential difference would therefore be approximately 30 volts as desired.

The Zener voltages of the diodes 44, 46 need not be identical. Rather, depending on the requirements placed on the protection circuit 42, the respective Zener voltages of the diodes 44, 46 may be established through differences in fabrication to be different from one another. Consequently, an asymmetric acceptance limit voltage range may be established for the contact point 26.

Figure 3:
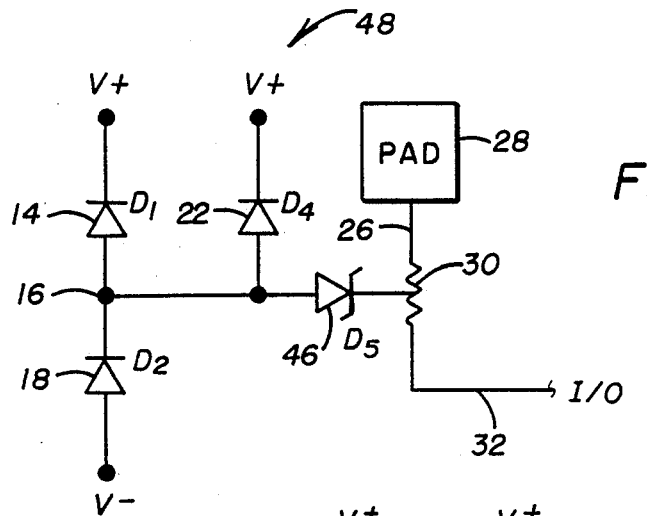
FIG. 3 is a circuit schematic of a second alternate preferred embodiment of the present invention.
Figure 4:
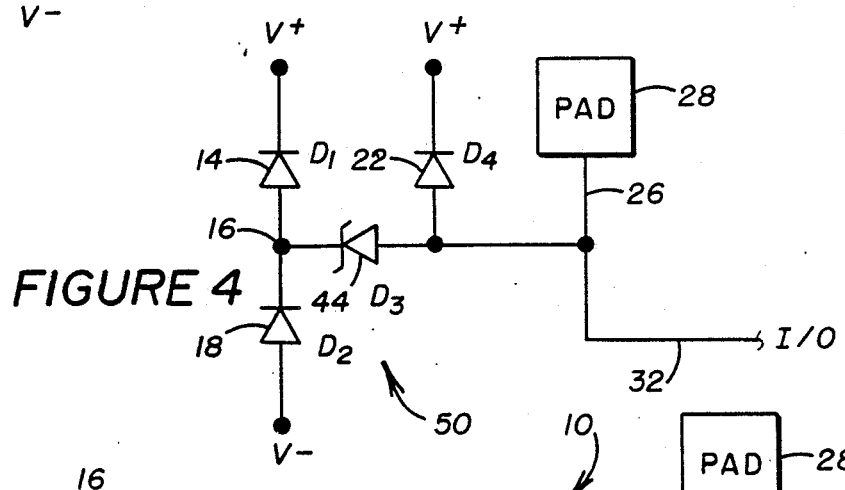
FIG. 4 is a circuit schematic of a third alternate preferred embodiment of the present invention.

However, if a highly asymmetric acceptance voltage potential limit range is desired, the alternate embodiments of the present invention shown in FIG. 3 and 4 may be utilized. The protection circuit 48 shown in FIG. 3 provides for a positive allowable voltage limit set largely by the Zener breakdown voltage of diode 24 above the positive voltage supply rail potential. The negative allowable voltage limit remains approximately equal to the negative voltage supply rail potential. These asymmetric voltage limits are more accurately described by equations 4 and 5.

$$V_{+limit} = {}^+V + V_{thD4} + V_{ZD5} + (I_{ESD} * R_{eff})  \quad \text{Eq. 4}$$

$$V_{-limit} = {}^-V - V_{thD2} - V_{thD5} + (I_{ESD} * R_{eff})  \quad \text{Eq. 5}$$

Similarly, the protection circuit 50 of FIG. 4 provides for a positive allowable voltage limit approximately equal to the positive voltage supply rail potential. The Zener diode 20 however establishes the negative allowable voltage limit at a potential below the negative voltage supply rail potential by a potential difference generally equal to its Zener breakdown potential. These voltage limits are defined by equations 6 and 7.

The protection circuits 48, 50 of FIGS. 3 and 4 need not employ the Zener diodes 46 and 44, respectively. Rather, the circuits 48, 50 could alternately employ the junction diodes 24 and 20 of FIG. 1 in place of diodes 46 and 44, respectively. Consequently, the present invention possesses substantial flexibility in allowing the positive and negative acceptable voltage limits to be set at a wide variety of voltage levels either mutually symmetric or asymmetric about a reference or ground potential depending on the needs of any specific operating environment.

$$V_{-limit} = {}^-V + V_{thD4}  \quad \text{Eq. 6}$$

$$V_{-limit} = {}^-V - V_{thD2} - V_{zD3}  \quad \text{Eq. 7}$$

Figure 5:
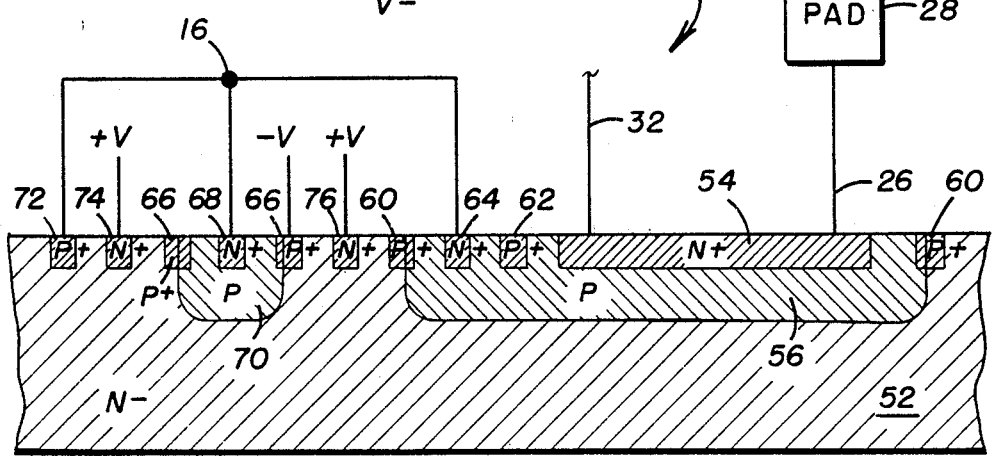
FIG. 5 is a simplified cross-section view of an integrated circuit illustrating the preferred fabrication of the circuit shown in FIG. 1.

Referring now to FIG. 5, a cross-section of an integrated circuit having the ESD protection circuit 10 fabricated therein is shown. For this preferred embodiment, an N− conductivity substrate 52 is utilized. The bonding pad 28 is conductively connected through a contact point trace 26 to an N+ conductivity region 54 formed within a larger P-well region 56 at the surface of the substrate 52. The region 54 forms a defused resistor between the contact point 26 and the I/O lead 32 conductively connected to an opposing end of the region 54. The junction between the region 54 and P-well 56 forms the junction of the diode 24. A conventional guard band region 60 is provided about the periphery of the P-well 56. An additional guard region 62 is provided in the P-well 56 between the region 54 and an N+ region 64. The junction between the N+ region 64 and P-well 56 forms the junction of the diode 20. Similarly, the junction between the P-well 56 and N− substrate 52 forms the junction of diode 22.

A conductive lead connects the N+ region 64 to the clamp point 16, an N+ region 68 within a second P-well 70 and P+ region 72. The junction between the N+ region 68 and P-well 70 forms the junction of diode 18 while the junction between the P+ region 72 and the substrate 52 forms the junction of diode 14.

The substrate 52 is conductively connected to the positive voltage source rail potential through N+ regions 74 and 76. The P-well 70 is conductively connected to the negative voltage source rail potential by contact to the P+ guardband 66 surrounding the periphery of the P-well 70.

Figure 6:
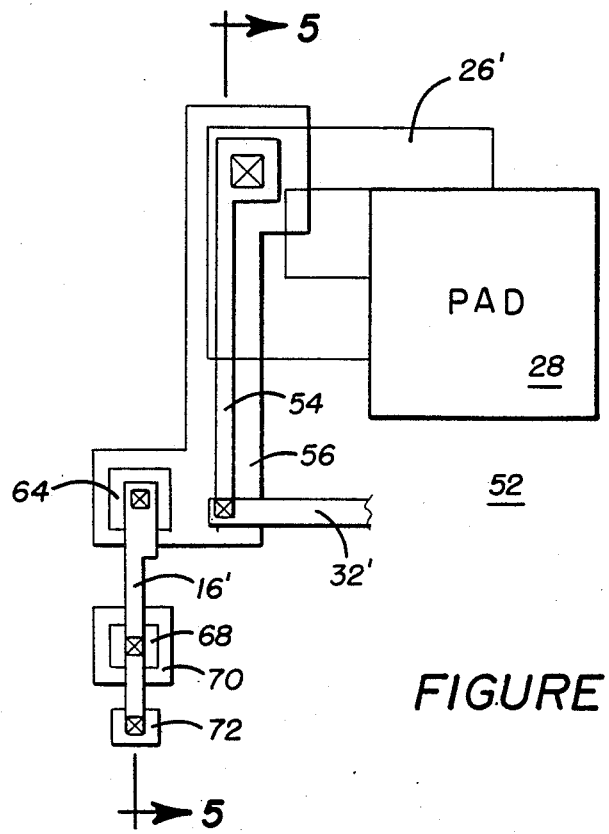
FIG. 6 is a simplified top view of an integrated circuit illustrating the preferred fabrication of the circuit shown in FIG. 1.

A simplified top view of the integrated circuit shown in FIG. 5 is provided in FIG. 6. The guardbands 60, 62 and 66, as well as the positive supply rail contact regions 74, 76. have been omitted to simplify the view. As shown, the bonding point 28 is coupled through conductive leads 26′ to one end of the region 54 as formed in the P-well 56. The opposite end of the resistive region 54 is coupled through a conductive lead 32′ to the applicable input or output circuitry also provided on the integrated circuit. A single conductive lead 16′ connects the N+ region 64, also formed within the P-well 56, to the N+ region 68 formed within the second P-well 70 and the P+ region 72 formed directly in the substrate 52.

Figure 7:
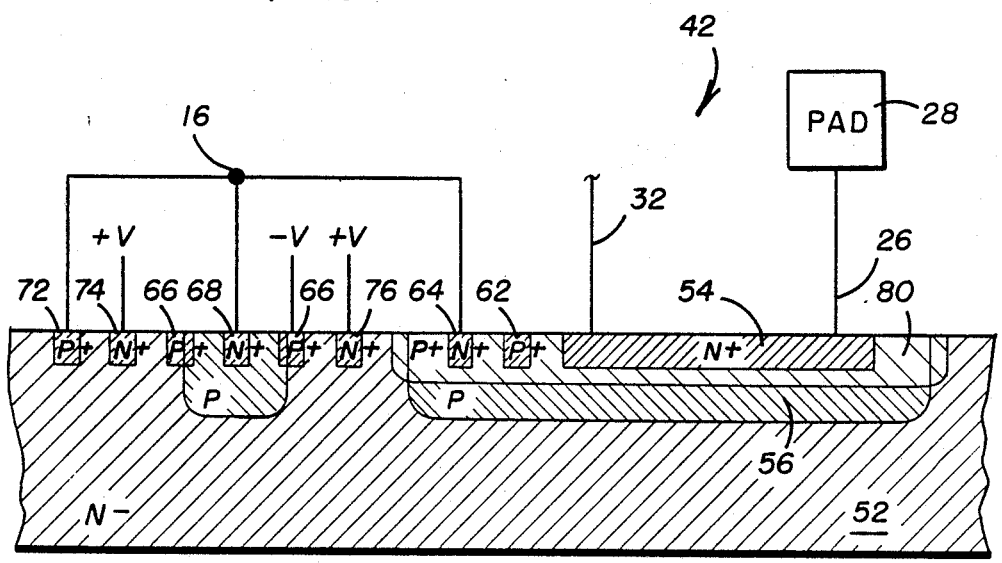
FIG. 7 is a simplified cross-section view of an integrated circuit illustrating the preferred fabrication of the circuit shown in FIG. 2.

FIG. 7 provides a cross section of an integrated circuit having the protection circuit 42 of FIG. 2 fabricated therein. The fabrication details of the protection circuit 42 are substantially the same as that of protection circuit 10 shown in FIG. 5. The only significant difference is that the guard band region 60, present in FIG. 5, has been effectively replaced by a high conductivity P+ region 80 overlapping the P-well 56 and encompassing the resistive region 54, isolation region 62 and N+ region 64. The operative consequence of the overlapping region 80 is that the diodes formed by junctions of the regions 54 and 64 will function as Zener diodes 44, 46. The difference in depth of the regions 54, 64 with respect to the corresponding depth of the overlapping well region 80, as well as the relative doping densities of these regions will control the Zener voltage potential of the diodes 44, 46. The control over the relative junction depth and selection of doping density levels for Zener diodes is well characterized.

The protection circuit 48 shown in FIG. 3 may be implemented by a minor modification to the fabrication of the protection circuit 42 as shown in FIG. 7. Zener diode 44 can be effectively eliminated by providing that the region 64, as shown in FIG. 7 is omitted and the contact point 16 conductive trace is connected directly to the overlapping region 80. Alternately, the protection circuit 50 of FIG. 4 can be fabricated as shown in FIG. 7 modified only in that the region 54 is omitted in its entirety. Consequently, the contact point 26 and I/O lead 32 are non-resistively connected to the cathode of diode 44 through the overlapping region 80.

Another modification that can be made in the fabrication of the protection circuit 42 shown in FIG. 7 will allow the combined use of junction 20, 24 and Zener diodes 44, 46 in any combination. This is achieved by limiting the overlapping region 80 to include only the resistive region 54 or, conversely, the region 64. In the former case, the resulting protection circuit includes a conventional diode 20 and a Zener diode 46. In the latter case, the resulting protection circuit includes a Zener diode 44 and conventional diode 24.

Consequently, a broad family of ESD protection circuits providing for the establishment of an acceptance input/output voltage limit range that may be varied symmetrically or asymmetrically from voltage levels approximately equal or extending well beyond the available voltage supply rail potentials was provided to a protected integrated circuit, has been described.

Clearly, many modifications and variations of the present invention are possible in light of the above description of the preferred embodiments of the present invention. Accordingly, it is therefore to be understood that, within the scope of the appended claims, the invention may be practiced otherwise in a specifically described herein.

We claim:

1. A circuit for limiting the voltage potential at a contact point of an integrated device relative to first and second predetermined voltage source potentials, said circuit comprising:
   (a) clamp means for limiting the voltage potential at a clamp point to a first voltage range approximately defined by the first and second predetermined voltage source potentials, said clamp means including first and second clamp diode junctions directly coupled in series between and non-conductively reversed biased with respect to the first and second predetermined voltage source potentials when the voltage potential at said clamp point is within a subrange of said first predetermined voltage range, the series connection between said first and second clamp diode junctions forming said clamp point; and
   (b) voltage offset means, coupled between said clamp point and said contact point, for establishing a second voltage range encompassing said first voltage range, said voltage offset means conducting current between said clamp point and said contact point to limit the voltage potential at said contact point to said second voltage range, said voltage offset means including a first diode junction provided in the current path between said clamp point and said contact point and wherein said first diode junction is reversed biased to a conductive state when the voltage potential at said contact point is at a first extreme of said second voltage range and said first or second clamp diode junction is conductively forward biased with respect to the first or second predetermined voltage source potential and said clamp point voltage potential is within said first predetermined voltage range exclusive of said subrange.

2. The circuit of claim 1 wherein said voltage offset means includes a second diode junction provided in the current path between said clamp point and said contact point, wherein said second diode junction is forward biased to a conductive state when said first diode junction is reverse biased to a conductive state when the voltage potential at said contact point is at said first extreme of said second voltage range, and wherein said first diode junction is forward biased to a conductive state and said second diode junction is reversed biased to a conductive state when the voltage potential at said contact point is at a second extreme of said second voltage range.

3. An integrated circuit for protecting a contact terminal of an MOS integrated device from ESD voltages in excess of first and second predetermined voltage limits, said circuit comprising:
   (a) a contact coupled to the contact terminal;
   (b) first and second voltage sources;
   (c) first and second diodes coupled in series between said first and second voltage sources, said first and second diodes being directly coupled at a series connection point such that said first and second diodes are nonconductively reversed biased with respect to said first and second voltage sources when the voltage potential at said contact is between said first and second predetermined voltage limits, and
   (d) standoff means, coupled between series connection point and said contact, for establishing a standoff voltage potential limit relative to said first and second voltage source, said standoff means enabling the conduction of current whenever the voltage potential difference between said series connection point and said contact exceeds said standoff voltage potential limit, said standoff means further limiting the reverse bias potential across said first and second diodes to twice the potential difference between said first and second voltage sources plus a single forward biased diode potential drop.

4. The integrated circuit of claim 3 wherein said standoff means includes a first limit diode coupled in the conduction path between said series connection point and said contact, the reverse breakdown voltage potential of said first limit diode defining said standoff voltage potential limit at least with respect to one of said first and second voltage sources.

5. The integrated circuit of claim 4 wherein said standoff means includes a second limit diode coupled in the conduction path between said series connection point and said contact, the reverse breakdown voltage potential of said second limit diode substantially defining said standoff voltage potential limit with respect to the complementary one of said first and second voltage sources.

6. A protection circuit for limiting the voltage potential at an input or output signal line of a protected circuit, the protection circuit and the protected circuit being provided on a common integrated circuit substrate, said protection circuit comprising:

(a) an integrated circuit contact pad;
(b) an integrated resistor conductively coupled between said integrated circuit contact pad and said signal line;
(c) first and second diodes coupled directly in series, at a series connection node, and between first and second voltage supply sources such that said first and second diodes are nonconductively reversed biased with respect to said first and second voltage supply sources when a potential at said contact pad is between a first polarity standoff voltage potential limit and a second voltage potential limit; and
(d) standoff means, coupled between said series connection node and said integrated resistor, for establishing said first and second polarity standoff voltage potential limits above which said standoff means conducts current through said first or second diodes, respectively, said standoff means further limiting the maximum reverse bias potential across said first and second diodes to twice the potential difference between said first and second voltage supply sources plus a single forward biased diode potential drop.

7. The protection circuit of claim 6 wherein said standoff means includes a first standoff diode conductively coupled to the length of said integrated resistor and wherein said first standoff diode establishes said first polarity standoff voltage potential limit for a first polarity voltage potential at said contact pad.

8. The protection circuit of claim 7 wherein said standoff means further includes a second standoff diode coupled in series with said first standoff diode, said second standoff diode establishing said second polarity standoff voltage potential limit for a second polarity voltage potential at said contact pad.

9. The protection circuit of claim 6 wherein said standoff means comprises first and second standoff diodes coupled in series such that either said first or second standoff diode is reverse biased.

10. A protection circuit for limiting the voltage potential at an input or output signal line of a protected circuit, the protection circuit and the protected circuit being provided on a common integrated circuit substrate, said protection circuit comprising:

(a) an integrated circuit contact pad;
(b) an integrated resistor conductively coupled between said integrated circuit contact pad and said signal line;
(c) first and second diodes couples in series, at a series connection node, and between first and second voltage supply sources, both said first and second diodes being reverse biased with respect to said first and second voltage supply sources; and
(d) first and second standoff diodes coupled in series between said series conduction node and said integrated resistor, said first standoff diode establishing a reverse biased first polarity standoff voltage potential limit above which said first standoff diode conducts current and said second standoff diode establishing a reverse biased second polarity standoff voltage potential limit above which said second standoff diode conducts current.

11. The protection circuit of claim 10 wherein said first standoff diode is a Zener diode.

12. The protection circuit of claim 10 wherein said first and second standoff diodes are Zener diodes.

* * * * *